US008189729B2

(12) United States Patent
Hoang et al.

(10) Patent No.: US 8,189,729 B2
(45) Date of Patent: May 29, 2012

(54) WIDE RANGE AND DYNAMICALLY RECONFIGURABLE CLOCK DATA RECOVERY ARCHITECTURE

(75) Inventors: Tim Tri Hoang, San Jose, CA (US); Sergey Yuryevich Shumarayev, San Leandro, CA (US); Wilson Wong, San Francisco, CA (US); Rakesh Patel, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 746 days.

(21) Appl. No.: 11/329,197

(22) Filed: Jan. 9, 2006

(65) Prior Publication Data

US 2009/0122939 A1    May 14, 2009

Related U.S. Application Data

(60) Provisional application No. 60/705,534, filed on Aug. 3, 2005.

(51) Int. Cl.
*H04L 7/00* (2006.01)
(52) U.S. Cl. ......................... 375/373; 375/324
(58) Field of Classification Search .................. 375/324, 375/360, 373, 374, 375, 376; 327/141, 142, 327/147, 151, 156, 157, 236; 331/25; 326/37, 326/38; 713/500
See application file for complete search history.

(56) References Cited

U.S. PATENT DOCUMENTS

| | | | |
|---|---|---|---|
| 5,512,860 A | 4/1996 | Huscroft et al. | |
| 5,684,434 A * | 11/1997 | Mann et al. | 331/16 |
| 5,689,195 A | 11/1997 | Cliff et al. | |
| 5,909,126 A | 6/1999 | Cliff et al. | |
| 6,075,416 A * | 6/2000 | Dalmia | 331/25 |
| 6,127,865 A * | 10/2000 | Jefferson | 327/149 |
| 6,211,741 B1 * | 4/2001 | Dalmia | 331/11 |
| 6,215,326 B1 | 4/2001 | Jefferson et al. | |
| 6,218,876 B1 * | 4/2001 | Sung et al. | 327/156 |
| 6,272,646 B1 * | 8/2001 | Rangasayee et al. | 713/500 |
| 6,307,413 B1 * | 10/2001 | Dalmia et al. | 327/166 |
| 6,407,576 B1 | 6/2002 | Ngai et al. | |
| 6,462,594 B1 * | 10/2002 | Robinson et al. | 327/159 |
| 6,566,967 B1 * | 5/2003 | Anumula et al. | 331/11 |
| 6,650,140 B2 | 11/2003 | Lee et al. | |
| 6,687,320 B1 * | 2/2004 | Chiu et al. | 375/376 |

(Continued)

FOREIGN PATENT DOCUMENTS

EP    1 104 113    5/2001

OTHER PUBLICATIONS

Ed Turner and David Law, IEEE P802.3ae MDC/MDIO, Sep. 17-19, 2001.*

(Continued)

*Primary Examiner* — Aristocratis Fotakis (74) *Attorney, Agent, or Firm* — Ropes & Gray LLP (57) ABSTRACT

Wide range and dynamically reprogrammable CDR architecture recovers an embedded clock signal from serial input data with a wide range of operating frequencies. In order to support a wide range of data rates, the CDR architecture includes multiple operating parameters. These parameters include various pre/post divider settings, charge pump currents, loop-filter and bandwidth selections, and VCO gears. The parameters may be dynamically reprogrammed without powering down the circuitry or PLD. This allows the CDR circuitry to switch between various standards and protocols on-the-fly.

20 Claims, 6 Drawing Sheets

U.S. PATENT DOCUMENTS

| | | | |
|---|---|---|---|
| 6,703,880 B1* | 3/2004 | Gailhard et al. | 327/159 |
| 6,856,180 B1* | 2/2005 | Starr et al. | 327/147 |
| 6,867,627 B1* | 3/2005 | Murtagh | 327/158 |
| 6,912,646 B1* | 6/2005 | Khu | 711/219 |
| 6,956,416 B2* | 10/2005 | Wilson et al. | 327/156 |
| 7,089,444 B1* | 8/2006 | Asaduzzaman et al. | 713/600 |
| 7,149,914 B1* | 12/2006 | Asaduzzaman et al. | 713/500 |
| 7,176,738 B1* | 2/2007 | Hwang et al. | 327/291 |
| 7,265,634 B2* | 9/2007 | Miki | 331/16 |
| 7,590,207 B1* | 9/2009 | Shumarayev et al. | 375/354 |
| 2001/0033188 A1 | 10/2001 | Aung et al. | |
| 2002/0037065 A1* | 3/2002 | Nakamura | 375/375 |
| 2004/0141577 A1* | 7/2004 | Brunn et al. | 375/376 |
| 2004/0201426 A1* | 10/2004 | Chou et al. | 331/1 A |
| 2004/0258188 A1* | 12/2004 | Kim et al. | 375/376 |
| 2005/0030001 A1* | 2/2005 | Jasa et al. | 324/76.53 |
| 2005/0200390 A1* | 9/2005 | Starr et al. | 327/156 |

OTHER PUBLICATIONS

Benyamin "A 40-43-Gb/s Clock and Data Recovery IC with Integrated SFI-5 1:16 Demultiplexer in SiGe Technology" IEEE Journal of Solid-State Circuits, IEEE Service Center, Piscataway, NJ, U.S., vol. 38, No. 12, 13 pages, Dec. 2003.

* cited by examiner

WIDE RANGE AND DYNAMICALLY RECONFIGURABLE CLOCK DATA RECOVERY ARCHITECTURE

CROSS-REFERENCE TO RELATED APPLICATIONS

This application claims the benefit of U.S. provisional Patent Application No. 60/705,534 filed Aug. 3, 2005, which is hereby incorporated by reference herein in its entirety.

BACKGROUND OF THE INVENTION

This invention relates generally to clock data recovery circuitry, and more particularly to wide range and dynamically reconfigurable clock data recovery circuitry that can be provided on or in association with programmable logic devices.

An increasingly important type of signaling between devices is signaling in which the clock signal information is embedded in a serial data stream so that no separate clock signal needs to be transmitted. For example, data may be transmitted serially in "packets" of several successive serial data words preceded by a serial "header" that includes several training bits having a predetermined pattern of binary ones and zeros. The clock signal information is embedded in the data signal by the high-to-low and/or low-to-high transitions in that signal, which must have at least one high-to-low or low-to-high transition within a certain number of clock signal cycles. At the receiver the clock signal is "recovered" from the data signal for use in properly processing the data in the data signal. For convenience herein this general type of signaling will be referred to generically as "clock data recovery" or "CDR" signaling.

CDR signaling is now being used in many different signaling protocols. These protocols vary with respect to such parameters as clock signal frequency, header configuration, packet size, data word length, number of parallel channels, etc.

Programmable logic devices ("PLDs") are well known as shown, for example, by such references as Cliff et al. U.S. Pat. No. 5,689,195, Cliff et al. U.S. Pat. No. 5,909,126, Jefferson et al. U.S. Pat. No. 6,215,326, and Ngai et al. U.S. Pat. No. 6,407,576. In general, a PLD is a general-purpose integrated circuit device that is programmable to perform any of a wide range of logic tasks. Rather than having to design and build separate logic circuits for performing different logic tasks, general-purpose PLDs can be programmed in various different ways to perform those various logic tasks. Many manufacturers of electronic circuitry and systems find PLDs to be an advantageous way to provide various components of what they need to produce.

CDR signaling is an area in which it would be highly desirable to have the ability to support a large number of communications standards. Since CDR signaling eliminates tight routing signal requirements, systems may be created with many different independent clock domains. These clock domains may support a variety of communications standards and protocols. For example, GIGE, XAUI, PIPE, SONET, and PCI-E are just a sample of the standards and protocols that may be supporting using CDR signaling. These standards and protocols may specify a wide range of data rates to support various applications. Accordingly, it would be desirable to provide a high performance, low power CDR architecture that is operable over a wide range of data rates. In addition, it would be further desirable to provide CDR architecture that is dynamically reconfigurable to support these various standards and protocols on-the-fly without disrupting other parts of the device.

The invention also includes methods of operating circuitry of the types summarized above.

Further features of the invention, its nature and various advantages, will become more apparent from the accompanying drawings and the following detailed description.

SUMMARY OF THE INVENTION

In accordance with embodiments of the invention, CDR circuitry is provided which may include CDR receiver circuitry, CDR transmitter circuitry, and/or both CDR receiver circuitry and CDR transmitter circuitry. The CDR circuitry of the invention is preferably largely programmable and may be included on an integrated circuit with other PLD circuitry, or it may be at least partially included on a separate integrated circuit. If the CDR circuitry is at least partly on a separate circuit, it may be configured to facilitate efficient coupling to a more traditional PLD integrated circuit (e.g., in a common package with the PLD).

CDR receiver circuitry in accordance with the invention preferably receives a reference clock signal from the source of the CDR data signal to be processed or from another suitable reference clock signal source. The frequency of the reference clock signal has a known relationship to the clock frequency of the CDR data signal, but it does not have to be in phase with the CDR data signal. The requirement for a separate reference clock signal deviates from typical CDR signaling, but it helps make it possible for the circuitry of this invention to be programmable to operate at any of wide range of CDR frequencies. And because the separate reference clock signal is not required to have any particular phase relationship to the CDR data signal, there are no constraints regarding possible skew (i.e., phase shift) between the reference clock signal and the CDR data signal. (Problems associated with skew are among the principal motivations for using CDR signaling, because with CDR signaling the clock signal is embedded in the data signal and therefore can never become skewed relative to the data signal.) The reference clock signal may be divided by one or more clock dividers to reduce the requirement of the CDR circuitry to operate at maximum reference clock speed. In addition, the clock dividers may allow multiple blocks of the CDR circuitry to be trained by this divided reference clock source, enabling the circuitry to support multi-crystal and/or independent channel operation.

The CDR receiver circuitry uses the reference clock signal and the CDR data signal to recover the embedded clock signal from the CDR data signal. Various parameters and options used in this recovery of the CDR data signal clock are preferably programmable to support various communications standards and protocols. For example, in addition to a number of reference clock divider settings, the CDR circuitry may also include programmable options relating to the charge pump, loop-filter, and voltage-controlled oscillator (VCO) blocks of the circuitry. The recovered clock signal may be used to deserialize the CDR data signal, again using preferably programmable parameters such as a word length parameter. The deserialized data may then be synchronized or buffered for processing in a different clock regime (e.g., in accordance with a clock signal in more traditional PLD circuitry that is associated with the CDR circuitry).

In addition to supporting a wide range of data rates through a variety of circuitry settings and options, the CDR circuitry is preferably dynamically reconfigurable to meet the requirements of various communications standards and protocols on-the-fly. Thus, the CDR circuitry may be programmed to meet one communications standard and then dynamically reprogrammed to meet another communications standard. This also makes the CDR circuitry capable of reprogramming one channel while the other channels remain operational. Dynamically reprogramming the CDR circuitry also eliminates the need to power down the PLD in order to reconfigure the device.

Further features of the invention, its nature and various advantages, will become more apparent from the accompanying drawings and the following detailed description.

DETAILED DESCRIPTION OF THE PREFERRED EMBODIMENTS

Figure 1:
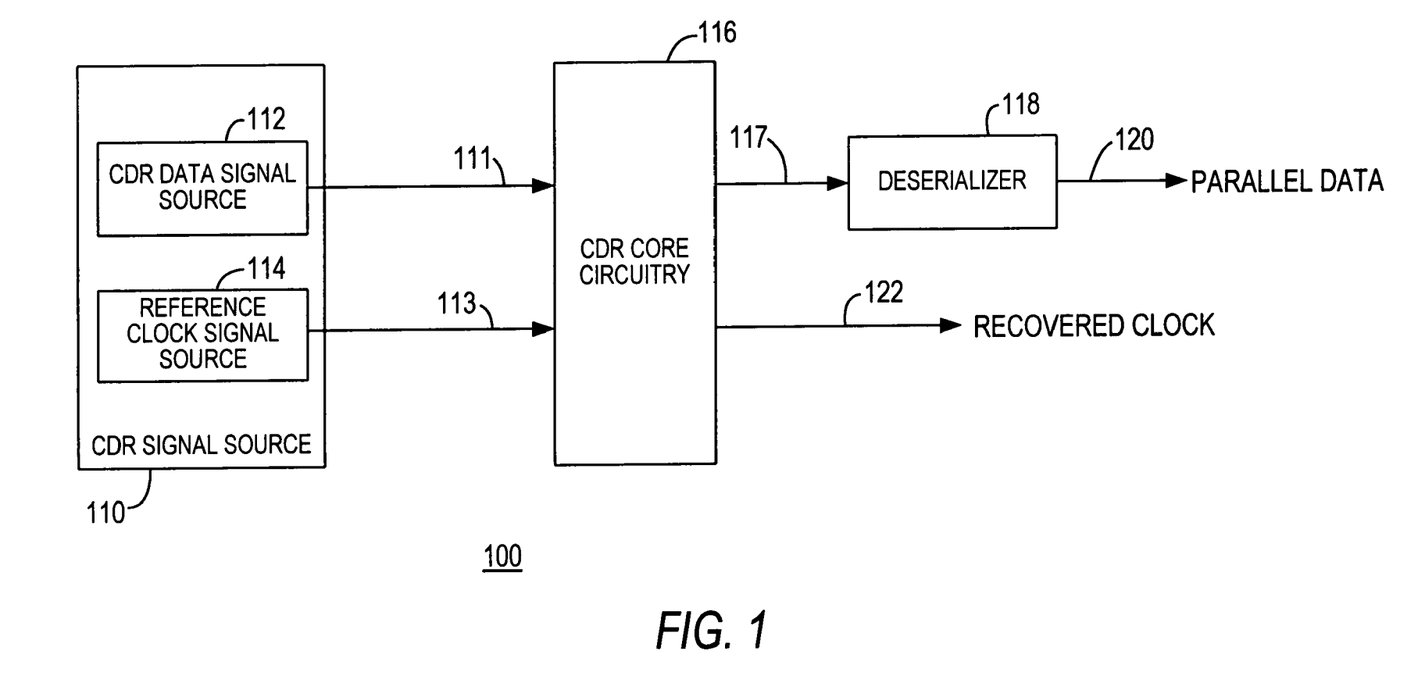
FIG. 1 is a simplified block diagram of illustrative CDR circuitry in accordance with the invention.

FIG. 1 shows an illustrative embodiment of CDR signaling apparatus 100 in accordance with the invention. CDR signaling apparatus 100 may include CDR signal source 110 and CDR core circuitry 116. CDR signal source 110 may include CDR data signal source 112 and reference clock signal source 114. CDR data signal source 112 may be conventional. The signal may be applied to a conventional differential signaling driver to produce a pair of differential CDR data output signal, if desired. Differential signaling is optional, and CDR data signal 111 could instead be transmitted on a single lead, as depicted in FIG. 1. CDR core circuitry 116 may receive both CDR data signal 111 and reference clock signal 113. Although in the example of FIG. 1, CDR core circuitry 116 receives reference clock signal 113 from CDR signal source 110, reference clock signal 113 could come from another suitable reference clock signal source.

CDR core circuitry 116 may attempt recovery of the embedded clock signal of CDR data signal source 112. Typically, recovery of the embedded clock is accomplished using at least one phase locked loop ("PLL") within CDR core circuitry 116. CDR core circuitry 116 may operate in one of two basic modes. CDR core circuitry 116 may use one feedback loop while in lock-to-reference ("LTR") mode and another feedback loop while in lock-to-data ("LTD") mode. At some point, CDR circuitry 116 must switch from LTR mode to LTD mode in order to begin data recovery. CDR circuitry 116 may then output a recovered clock signal on lead 122 and output a recovered data signal on lead 117. Optionally, one or both of these signals may be applied to deserializer 118, which may convert the applied retimed serial data to parallel data 120. CDR circuitry associated with PLD circuitry is shown in more detail in Aung et al. U.S. Patent Application No. 2001/0033188, filed Mar. 13, 2001, which is hereby incorporated by reference herein in its entirety.

Figure 2:
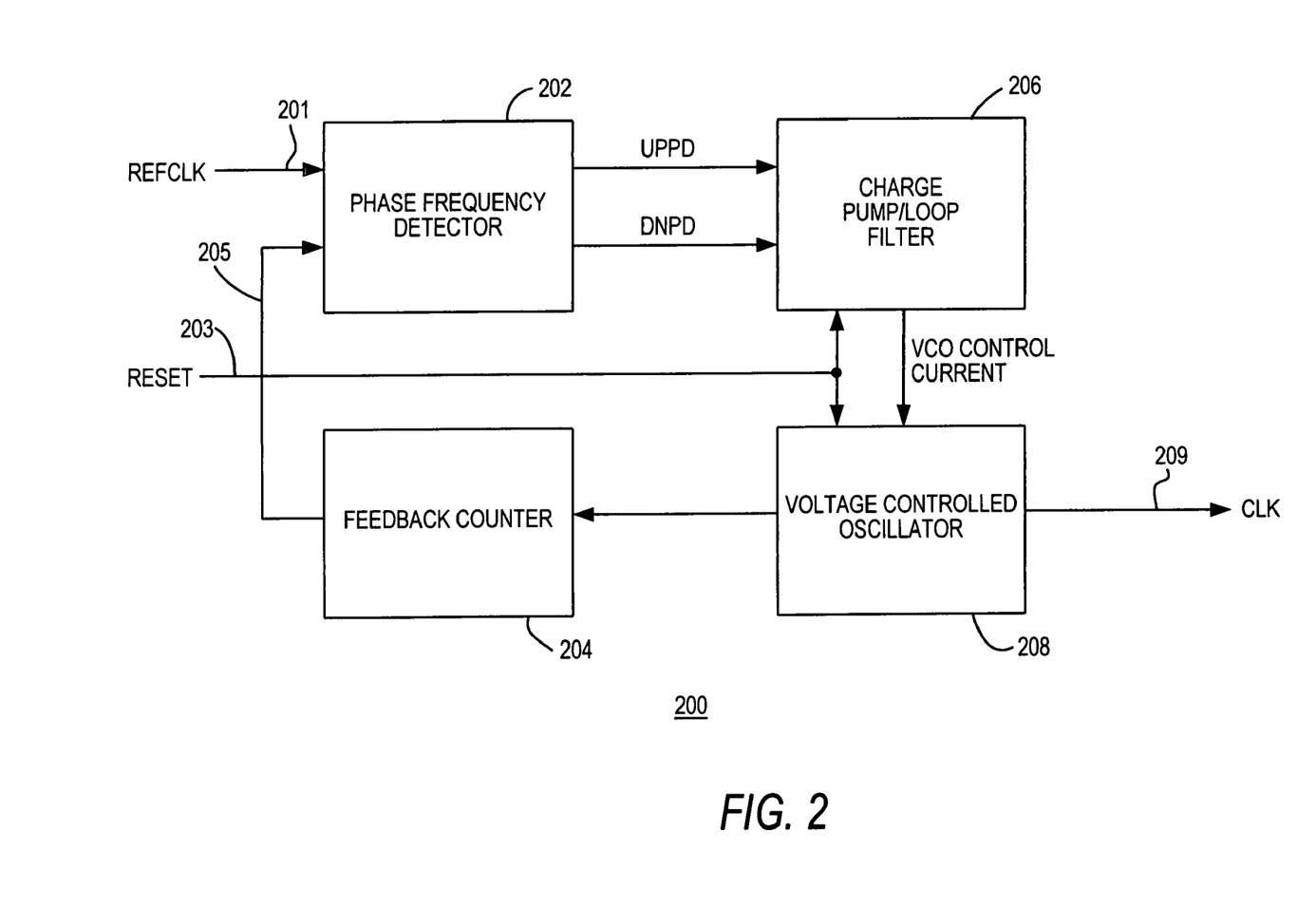
FIG. 2 is a simplified schematic block diagram of an illustrative embodiment of a representative portion of the circuitry shown in FIG. 1 in accordance with the invention.

FIG. 2 show a simplified block diagram of an illustrative portion of the CDR circuitry shown in FIG. 1. CDR circuitry 200 may include phase frequency detector ("PFD") block 202, charge pump and loop filter block 206, feedback counter block 204, and VCO block 208. Circuitry 200 is basically a phase locked loop ("PLL") and will therefore sometimes be referred to as such herein. This loop may be used while the CDR is in LTR mode. Reference clock signal 201 is received by PFD block 202. PFD block 202, which may be conventional, compares the phase and frequency of reference clock signal 201 with the feedback signal 205 of feedback counter block 204. PFD block 202 is configured to output a signal (or a pair of signals) indicative of whether feedback signal 205 should be speeded up or slowed down to better match the phase and frequency of reference clock signal 201. Thus, PFD block 202 may output a signal indicative of the phase and frequency error between its two input signals. In some embodiments, to minimize phase skew and other distortion when the CDR circuitry has switched to LTD mode, minimal equal up and down current pulses may be generated by PFD block 202 for every reference clock edge.

Charge pump/loop filter block 206 integrates the output signal or signals of PFD block 202 and adds or removes the appropriate amount of charge from the loop control node in the loop filter. This, in turn, slows down or speeds up the VCO in VCO block 208. The effect is to make the output signal of VCO block 208 better match reference clock signal 201 with regard to phase and frequency. In some embodiments, charge pump/loop filter block 206 includes a regulator (e.g., a 1.8V regulator) to regulate the charge pump power supply from another power supply so that the charge pump may provide an equal up and down current to the loop filter when the CDR circuitry is in LTD mode. The regulator may also improve the power supply noise rejection ratio so that any noise from the power supply is filtered out before reaching the charge pump. The charge pump may also include a unity gain op-amp to compensate for any charge loss because of charge sharing. Thus, quick recovery to VCO control voltage can be achieved to help control the amount of charge added or removed from the loop filter. Finally, the charge pump may also include a compensation loop for controlling the switching nodes to guarantee an equal up or down current over a wide range of control voltages (e.g., from 0.25 V to 1.45 V).

VCO block 208 may include a two-stage, differential ring voltage-controlled oscillator with a voltage regulator for superior noise performance. In some embodiments, the VCO has more than one gear (or bandwidth selection) to support a wide range of frequencies. For example, a high gear and a low gear may be defined. These gears may correspond to a programmable VCO capacitance load. For example, the high gear may support high frequency operation by using a lower capacitance load. The high gear may produce higher VCO phase noise. The low gear may support lower frequencies using a higher capacitance load with lower VCO phase noise. Although two gears may be used in some embodiments, any number of gears may be defined (e.g., five gears—high, high-middle, middle, middle-low, and low—may be defined) in other embodiments. Each gear is designed to support a variety of different applications. This allows the CDR circuitry to be compatible with a wide range of data rates. VCO block 208 may produce four clock signals on lead(s) 209, all having the same frequency but shifted in phase relative to one another. CLK0 and CLK180 may be used to sample even and odd data bits, while CLK90 and CKK270 may be used to detect transition edges. The clock signals may be used to recover data when the circuitry is in LTD mode. The recovered clock may also be provided to a deserializer block positioned after the CDR circuitry.

The output of VCO block 208 may also be received by feedback counter 204, which may divide the signal frequency by one or more scale factors. The scale factors may be programmable. For example, the desired scale factors may be stored in one or more programmable function control elements ("FCEs"). In some embodiments, the scale factors may extend the tuning range from below 300 MHz and up to 3.25 GHz.

The circuitry of FIG. 2 may be reset in a controlled manner. For example, reset signal 203 may reset the PLL when a loss of lock condition is detected in the PLL. Reset signal 203 may also reset charge pump/loop filter block 206 and/or VCO block 208 while dynamically reconfiguring the circuitry.

Figure 3:
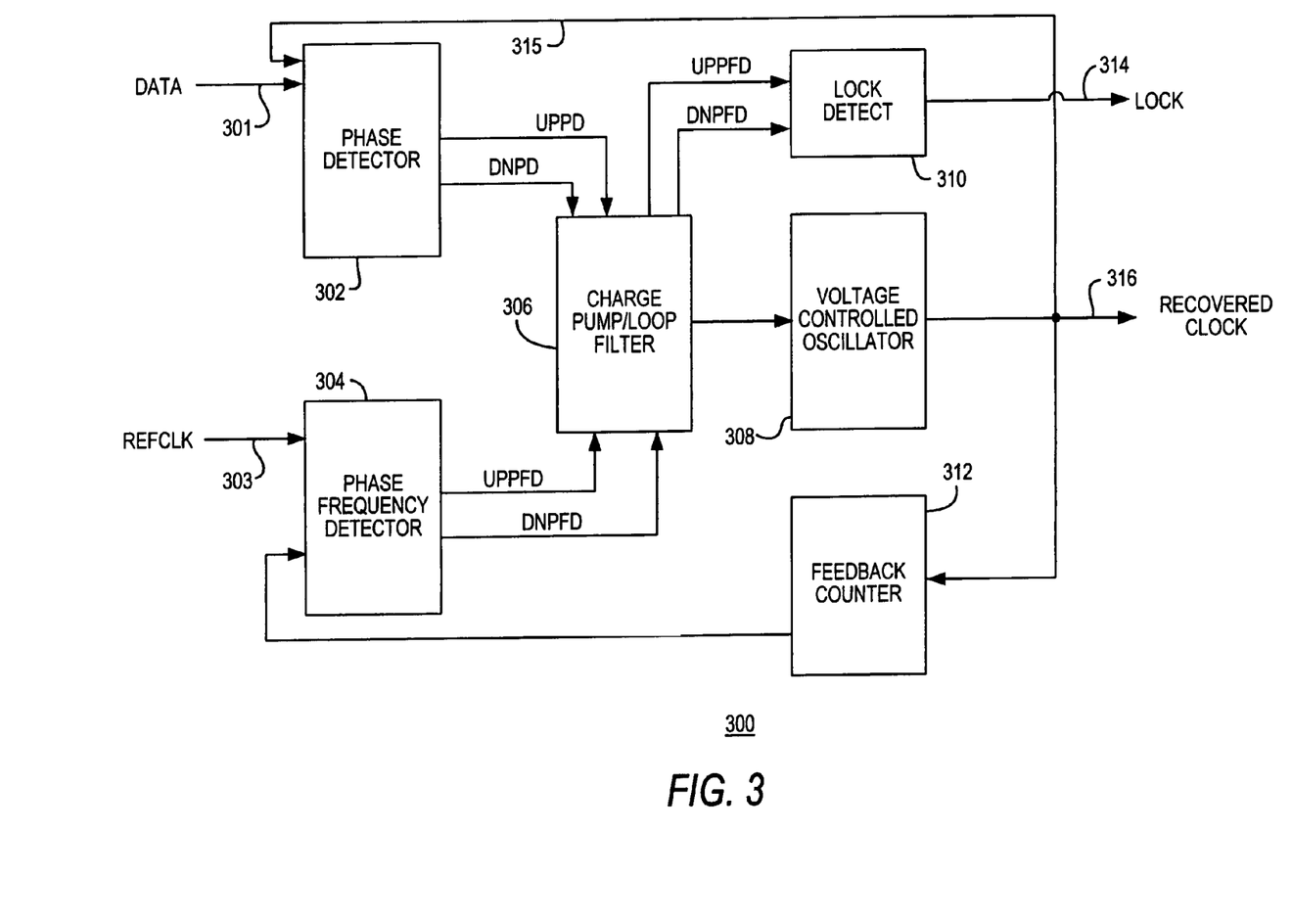
FIG. 3 is a more detailed, yet still simplified schematic block diagram of an illustrative embodiment of a representative portion of the circuitry shown in FIG. 1 in accordance with the invention.

FIG. 3 is a simplified block diagram of CDR circuitry 300 showing both the lower LTR feedback loop of FIG. 2 and the upper LTD feedback loop. In addition to PFD block 304, charge pump/loop filter block 306, VCO block 308, and feedback counter block 312, circuitry 300 may also include phase detector block 302 and lock detect block 310. Phase detector block 302, charge pump/loop filter block 306, and lock detect block 310 may create the upper LTD feedback loop. Similar to the loop depicted in FIG. 2, this upper feedback loop operates like a PLL and is sometimes referred to herein as as digital phase locked loop ("DPLL") circuitry.

Phase detector block 302 receives both CDR data signal 301 and feedback clock signal output 315 from VCO block 308. In some embodiments, phase detector block 302 may receive two feedback clock signals from VCO 308. One of these signals may be intended for comparison with rising edges in the CDR data signal, while the other signal may be intended for comparison with falling edges in the data signal. Phase detector block 302 compares the phases of the signals it receives and produces an output signal for charge pump/loop filter block 306. The output signal from phase detector block 302 may indicate whether feedback clock signal 315 needs to be speeded up or slowed down to work better with the phase transitions in the CDR data signal source. Thus, the signal or signals output from phase detector block 302 may be proportional to the phase error between CDR data signal 301 and feedback clock signal 315.

Charge pump/loop filter block 306 may listen to signals from phase detector block 302 while in LTD mode and signals from PFD block 304 while in LTR mode. Charge pump/loop filter block 306 may output its up and down control signals to lock detect block 310. Lock detect block 310 may signal a lock condition when the frequencies of feedback clock signal 315 and reference clock signal 303 are the same (or within some programmable range). The lock signal may be output from lock detect block 310 as lock signal 314. VCO block 308 may output the recovered clock signal on lead(s) 316.

Figure 4:
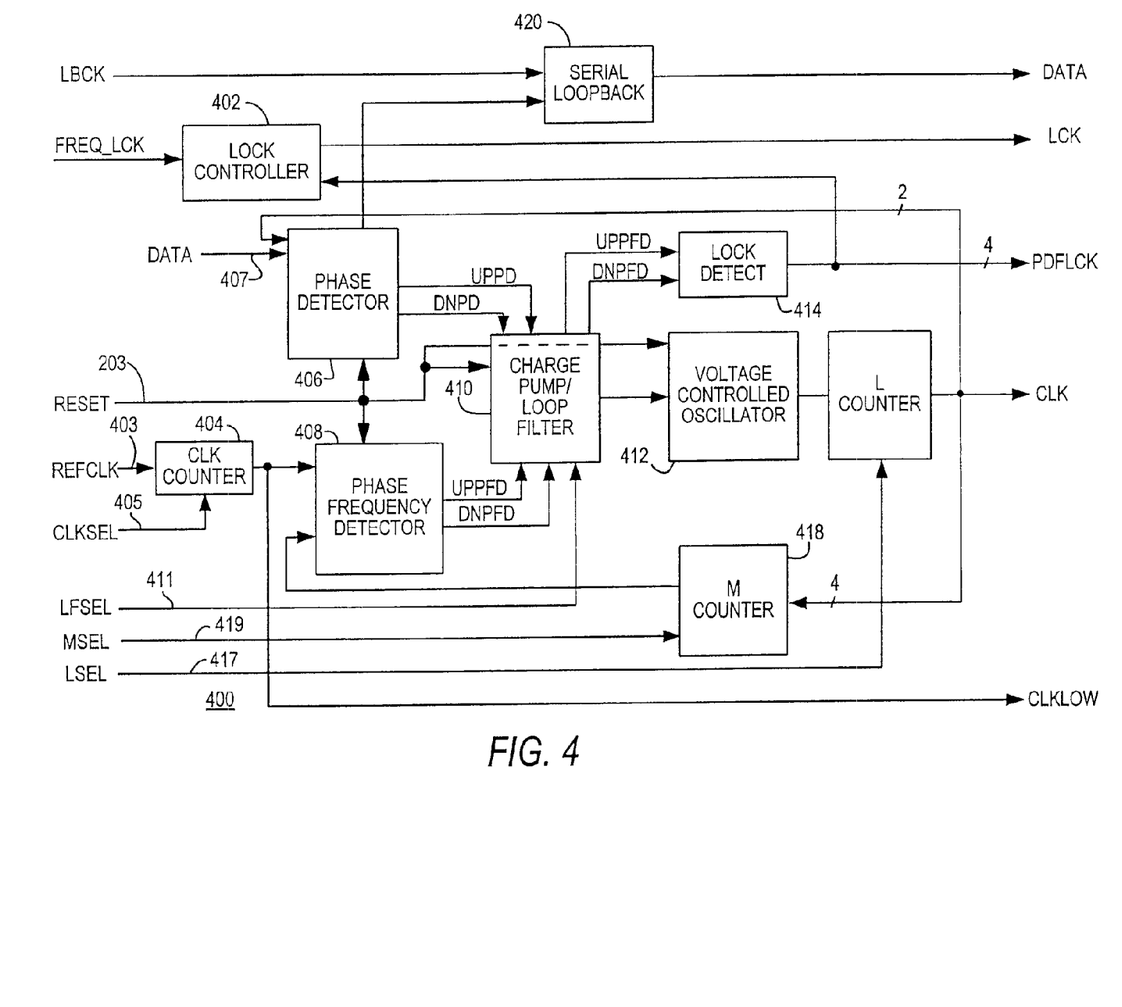
FIG. 4 is a more detailed, yet still simplified schematic block diagram of an illustrative embodiment of the CDR circuitry shown in FIG. 1 in accordance with the invention.

FIG. 4 shows a more detailed, yet still simplified, block diagram of the CDR circuitry of FIG. 1 in accordance with one embodiment of the invention. CDR circuitry 400 includes several configuration options. These options allow all the major blocks of CDR circuitry 400 to be reconfigured to meet new specifications, requirements, and/or data rates. In some embodiments, CDR circuitry 400 is dynamically reconfigured on-the-fly without powering down the PLD, line card, or system. Although CDR circuitry 400 shows the major configuration options via a number of different inputs to CDR circuitry 400, other configuration options exist to customize the operation of CDR circuitry 400 to meet the most stringent specifications. For example, CDR circuitry 400 may include various frequency divider settings, charge pump current settings, loop-filter and bandwidth selections, and VCO gear settings, as described in more detail below.

As described in regard to circuitry 300 of FIG. 3 and circuitry 200 of FIG. 2, CDR circuitry 400 may include phase detector block 406, PFD block 408, charge pump/loop filter block 410, lock detect block 414, and VCO block 412. Generally, CDR circuitry 400 uses reference clock signal 403 and CDR data signal 407 to recover the embedded clock signal from the CDR data signal. To operate at a wide range of frequencies, CDR circuitry 400 may accept several configuration options. These options may be user-programmable. For example, clock selection signal 405 may be input to clock counter 404. Clock counter 404 may be operative to divide reference clock signal 403 by a desired factor. By dividing the reference clock signal, the requirement of the CDR circuitry to operate at maximum reference clock speed is eliminated. In addition, clock counter 404 may allow multiple blocks of the CDR circuitry to be trained by this divided reference clock source, enabling the circuitry to support multi-crystal and/or independent channel operation. Although only one clock counter is depicted in FIG. 4, CDR circuitry 400 may include more than one instance of clock counter 404 and clock selection signal 405 in some embodiments. For example, a first clock counter may optionally divide reference clock signal 405 by 2, while a second clock counter positioned after the first clock counter may optionally divide reference clock signal 405 by 2 or 4. This may result in a total reference clock division of 8 depending on the clock selection input signals.

CDR circuitry may also include one or more feedback clock dividers. In the example of FIG. 4, CDR circuitry 400 includes L counter 416 and M counter 418. L counter 416 may be used in both LTD and LTR modes, while M counter 418 may be used in LTR mode only. L counter 416 and M counter 418 may take as input L divider selection signal 417 and M divider selection signal 419, respectively. In one embodiment, selection signals 417 and 419 may indicate various division settings from 1 to 25. However, L counter 416 and M counter 418 may be operative to divide their respective inputs by any desired amount. In some embodiments, L counter 416 may extend the tuning range of CDR circuitry 400 from below 300 MHz and up to 3.25 GHz and improve the performance of VCO block 412. M counter 418 may divide the output signal of VCO block 412 to be used as the feedback clock to PFD block 408.

Table 1 below shows some illustrative settings for L counter 416, M counter 418, the reference clock counter 404 as well as the frequency of the VCO and reference clocks. The settings in Table 1 are merely exemplary settings for use by one embodiment of the CDR circuitry to support some common communications protocols and standards. The standards in Table 1 are not exhaustive and other standards are supported. Actual settings will vary depending on, for example, the number of reference clock dividers used, the loop filter and VCO bandwidth selections, the exact CDR implementation, and the desired application.

TABLE 1

Illustrative CDR Circuitry Settings

| Standard | Reference Clock (MHZ) | Reference Clock Divider (divide by) | M Counter (divide by) | L Counter (divide by) | VCO Frequency (MHz) |
|---|---|---|---|---|---|
| PCI-E | 100 | 2 | 25 | 1 | 1250 |
|  | 156.25 | 1 | 20 | 1 | 3125 |
| CEI | 156.25 | 1 | 20 | 1 | 3125 |
|  | 622.08 | 2 | 10 | 1 | 3110.4 |

TABLE 1-continued

Illustrative CDR Circuitry Settings

| Standard | Reference Clock (MHZ) | Reference Clock Divider (divide by) | M Counter (divide by) | L Counter (divide by) | VCO Frequency (MHz) |
|---|---|---|---|---|---|
| GIGE | 62.5 | 1 | 10 | 1 | 625 |
|  | 125 | 1 | 5 | 1 | 625 |
| XAUI | 156.25 | 1 | 10 | 1 | 1562.5 |
| SONET OC-48 | 77.76 | 1 | 16 | 1 | 1244.16 |
|  | 155.52 | 1 | 8 | 1 | 1244.16 |
|  | 311.04 | 1 | 4 | 1 | 1244.16 |
|  | 622.08 | 2 | 4 | 1 | 1244.16 |
| SONET OC-12 | 62.2 | 1 | 5 | 4 | 1244 |
|  | 311 | 1 | 1 | 4 | 1244 |

In addition to the settings described above, charge pump/loop filter block 410 may receive as input loop filter setting 411. Loop filter setting 411 may be used to adjust a programmable capacitance load and resistance setting in the loop filter. In some embodiments, loop filter setting 411 is a four-bit setting. Two bits may be used to program the loop filter resistor setting and two bits may be used to program the loop filter capacitance load. Various other charge pump current settings and loop filter settings may be used to improve the bandwidth of the feedback loop. For example, to vary the VCO output loading, a high gear and a low gear may be defined, as previously described. These gears may correspond to a programmable VCO capacitance load. The high gear may support high frequency operation by using a lower capacitance load. The high gear may result in higher VCO phase noise. The low gear may support lower frequency operation using a higher capacitance load with lower VCO phase noise. By using more than one VVCO gear, circuitry 400 may support a wide range of CDR data rates.

For high performance using very high data rates (e.g., up to 3.25 GHz), dynamic flip-flops are used in almost all major CDR blocks. Since these flip-flops may be susceptible to sub-threshold leakage, which may lead to a functional failure when the CDR circuitry is operating at very low data rates, a smart keeper and flip-flop daisy chain architecture are used to prevent CDR failures at low data rates. In addition, to combat control signal noise, regulators are used extensively to improve the power supply noise ratio. In addition, all CDR blocks may be powered down when inactive to reduce power consumption. To further reduce power consumption, the VCO may be carefully designed as a differential ring oscillator as opposed to the more traditional LC-tank style VCO.

Lock controller block 402 may generate signals used to switch CDR circuitry 400 between LTD and LTR modes. Once in LTD mode, CDR circuitry 400 may begin recovering the serial data from the CDR data input signal. The operation of lock controller block 402 may be controlled by the output of lock detect block 414. Lock controller block 402 may compare the PPM frequency difference between the training feedback clock and the reference clock. When the difference between these two clocks are below some user-programmable threshold and the PPM frequency lock input is set, lock controller block 402 may output a frequency lock signal to charge pump/loop filter block 410. This signal may cause charge pump/loop filter block 410 to listen to one of phase detector block 406 or PFD block 408. This effectively causes CDR circuitry 400 to switch between LTR and LTD modes. Although lock controller 402 as shown in FIG. 4 is integrated with CDR circuitry 400, lock controller 402 may be wholly or partly on a separate integrated device or circuit.

The recovered data may be input to serial loopback block 420. This block may include a high-speed multiplexer that takes the recovered data and clock from phase detector block 406 and routes the recovered data to a transmit buffer. The data output of loopback block 420 may then be used to reroute or rebroadcast the serial data to another device, as desired.

Figure 5:
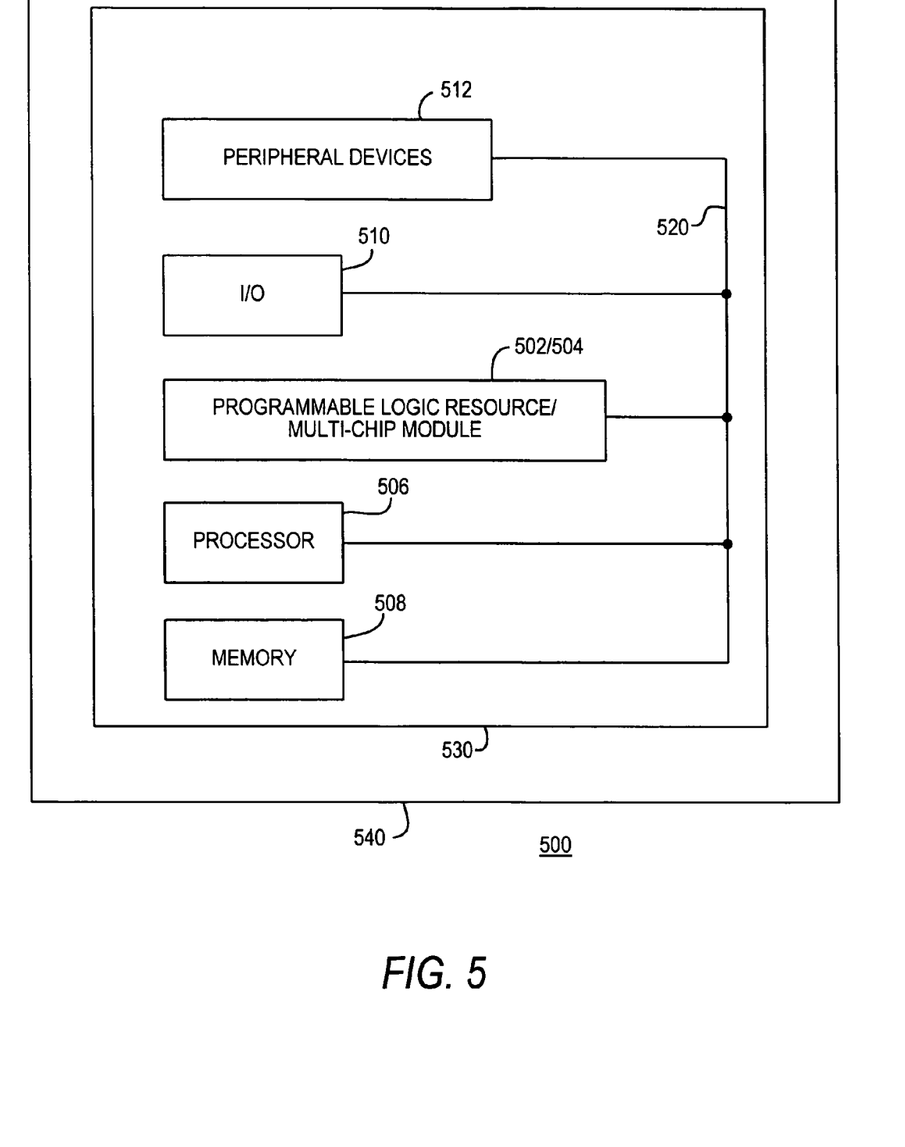
FIG. 5 is a simplified schematic block diagram of an illustrative system employing a programmable logic resource, multi-chop module, or other suitable device in accordance with the invention.

FIG. 5 illustrates programmable logic resource 502, multi-chip module 504, or other device (e.g., ASSP, ASIC, full-custom chip, dedicated chip), in accordance with embodiments of the invention in a data processing system. Data processing system 500 may include one or more of the following components: processor 506, memory 508, I/O circuitry 510, and peripheral devices 512. These components are coupled together by a system bus or other interconnections 520 and are populated on circuit board 530, which is contained in end-user system 540. For example, interconnections 520 may comprise standard PCI, PCI-X, or PCI Express interconnect technology.

Figure 6:
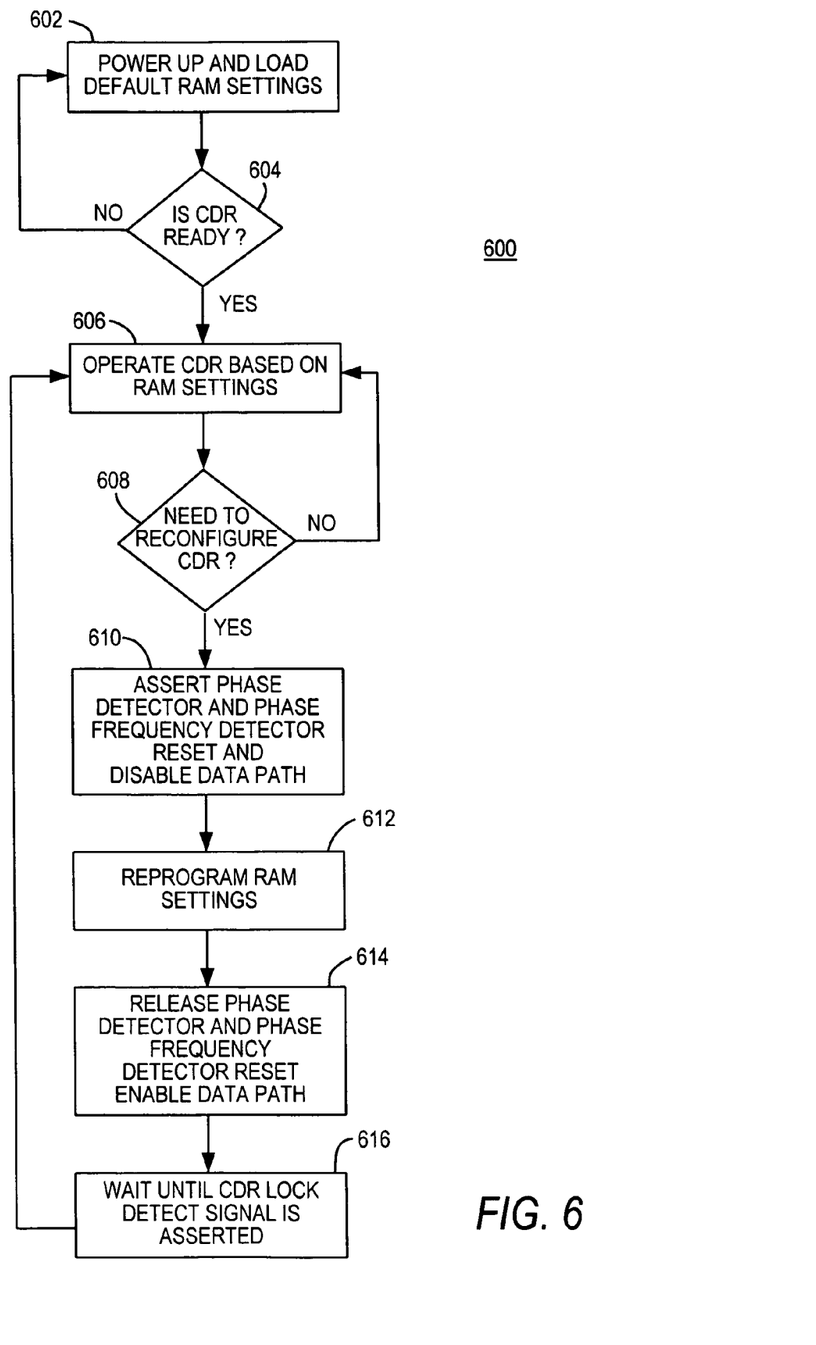
FIG. 6 is an illustrative process for dynamically reconfiguring the CDR circuitry of FIG. 4 in accordance with one embodiment of the invention.

FIG. 6 shows illustrative process 600 for dynamically reconfigure the CDR circuitry of the invention. Dynamic reconfiguration allows the circuitry to support a new standard, protocol, or data rate without powering down the PLD, line cards, or the system. On-the-fly dynamic reconfiguration may be useful in many situations, especially when one channel needs to be reprogrammed while other channels remain operational. All the CDR settings described herein may be updated simultaneously or individually as required.

The first step in illustrative method 600 is to power up the PLD and load the default CDR RAM settings. This occurs at step 602. At decision block 604, the circuitry may determine if it is ready for operation. Once the CDR circuitry is ready for operation, normal CDR operation may begin based on the default RAM settings loaded at step 606. At decision block 608, the circuitry may determine if the CDR needs to be reconfigured. If reconfiguration is desired, the phase detector and PFD reset signal may be asserted, thereby resetting these two block in a controlled manner. The CDR data path may also be disabled at step 610. At step 612, the CDR settings may be reprogrammed. In one embodiment, an MDIO (Management Data I/O) interface may be used to program a CDR configuration register bank accessible by the CDR circuitry. After the new settings are programmed, the reset signal asserted in step 610 may be released and the data path may be enabled at step 614. Finally, when the CDR lock detect signal goes high, the CDR data is being recovered correctly at step 616. Additionally reconfigurations may be performed as need on-the-fly.

In practice, one or more steps shown in process 600 may be combined with other steps, performed in any suitable order, performed in parallel—e.g., simultaneously or substantially simultaneously—or deleted. For example, the determination to reconfigure the CDR circuitry at decision block 608 may be made before normal operation based on the default settings at step 606.

It will be understood that the foregoing is only illustrative of the principles of the invention, and that various modifications can be made by those skilled in the art without departing from the scope and spirit of the invention. For example, the CDR configuration options described herein are merely illustrative. Other configuration options exist which may be equally or better suited to support a wide variety of CDR applications.

The above described embodiments of the present invention are presented for purposes of illustration and not of limitation, and the present invention is limited only by the claims which follow.

What is claimed is:

1. Wide range clock data recovery (CDR) circuitry comprising:
    means for receiving a CDR data signal; means for receiving a reference clock signal;
    means for dividing the reference clock signal by a first user-programmable value to produce a divided reference clock signal;
    means for dividing a first feedback clock signal to phase detector circuitry by a second user-programmable value;
    means for further dividing the first feedback clock signal by a third user-programmable value to produce a second feedback clock signal to phase frequency detector circuitry, wherein the means for further dividing is coupled to the means for dividing the first feedback clock signal;
    means for applying the divided reference clock signal to the phase frequency detector circuitry for comparison to the second feedback clock signal; means for outputting a clock signal recovered from the CDR data signal; and
    means for reconfiguring the CDR circuitry by changing at least one of the first, second, and third user-programmable values without powering down the CDR circuitry, but with resetting the phase detector circuitry and the phase frequency detector circuitry, wherein the phase detector circuitry and the phase frequency detector circuitry are distinct and coupled to a reset signal that is asserted when reconfiguring the CDR circuitry, without resetting circuitry within the CDR circuitry other than the phase detector circuitry and the phase frequency detector circuitry.

2. The CDR circuitry of claim 1 further comprising means for dynamically reprogramming the first user-programmable value, the second user-programmable value, and the third user-programmable value.

3. The CDR circuitry of claim 2 wherein the means for dynamically reprogramming the first user-programmable value, the second user-programmable value, and the third user-programmable value allows the CDR circuitry to be reprogrammed without powering down the CDR circuitry.

4. The CDR circuitry of claim 1 wherein the reference clock signal has a pre-determined relationship to the CDR data signal.

5. The CDR circuitry of claim 4 wherein the pre-determined relationship comprises a scale factor.

6. The CDR circuitry of claim 1 wherein the means for receiving a CDR data signal is programmable with respect to at least one operating parameter.

7. Wide range clock data recovery (CDR) circuitry comprising:
    phase detector circuitry configured to receive a CDR data signal;
        first clock counter circuitry configured to divide a reference clock signal by a first user-programmable value to produce a divided reference clock signal;
        second clock counter circuitry configured to divide a first feedback clock signal to the phase detector circuitry by a second user-programmable value; third clock counter circuitry coupled to the second clock counter circuitry and configured to further divide the first feedback clock signal by a third user-programmable value to produce a second feedback clock signal;
    phase frequency detector circuitry configured to receive the divided reference clock signal and the second feedback clock signal and compare the divided reference clock signal to the second feedback clock signal; output circuitry configured to output a recovered clock signal from the received CDR signal; and
    control circuitry configured to reconfigure the CDR circuitry by changing at least one of the first, second, and third user-programmable values without powering down the CDR circuitry, but with resetting the phase detector circuitry and the phase frequency detector circuitry, wherein the phase detector circuitry and the phase frequency detector circuitry are distinct and coupled to a reset signal that is asserted when reconfiguring the CDR circuitry without resetting circuitry within the CDR circuitry other than the phase detector circuitry and the phase frequency detector circuitry.

8. The CDR circuitry of claim 7 further comprising an I/O interface for dynamically reprogramming the first user-programmable value, the second user-programmable value, and the third user-programmable value.

9. The CDR circuitry of claim 8 wherein the I/O interface allows the circuitry to be reprogrammed without powering down the circuitry.

10. The CDR circuitry of claim 7 wherein the reference clock signal has a pre-determined relationship to the CDR data signal.

11. The CDR circuitry of claim 7 wherein the pre-determined relationship comprises a scale factor.

12. A method for dynamically reconfiguring wide range clock data recovery (CDR) circuitry, the method comprising:
    receiving at least one default CDR operating parameter from a memory;
    receiving a CDR data signal at a phase detector circuitry and a reference clock signal at a phase frequency detector circuitry;
    receiving at least one user-defined CDR operating parameter;
    resetting the phase detector circuitry and the phase frequency detector circuitry in response to receiving the at least one user-defined CDR operating parameter, wherein the phase detector circuitry and the phase frequency detector circuitry are distinct and coupled to a reset signal that is asserted when reconfiguring the CDR circuitry, without resetting circuitry within the CDR circuitry other than the phase detector circuitry and the phase frequency detector circuitry; and
    reconfiguring the CDR circuitry based at least in part on the at least one user-defined CDR operating parameter without powering down the CDR circuitry, wherein:
        the at least one user-defined CDR parameter comprises one or more of a first operating parameter, a second operating parameter and a third operating parameter;
        reconfiguring the CDR circuitry comprises dividing the reference clock signal by a first operating parameter, dividing the first feedback clock signal to the phase detector circuitry by the second operating parameter, and further dividing the first feedback clock signal by the third operating parameter to produce a second feedback clock signal to the phase frequency detector circuitry.

13. The method of claim 12 wherein the at least one user-defined CDR operating parameter allows the CDR circuitry to support at least one communications standard selected from the group consisting of PCI-E, CEI, GIGE, XUAI, SONET OC-48, and SONET OC-12.

14. The method of claim 12 wherein the at least one user-defined CDR operating parameter is received via an I/O interface.

15. The method of claim 14 wherein the I/O interface comprises an MDIO interface.

16. A dynamically reconfigurable wide range clock data recovery (CDR) circuitry comprising:
a memory for storing at least one default CDR operating parameter;
phase detector circuitry configured to receive a CDR data signal;
phase frequency detector circuitry configured to receive a reference clock signal;
an I/O interface configured to receive at least one user-defined CDR operating parameter and reprogram the at least one default CDR operating parameter with the at least one user-defined CDR operating parameter, wherein the at least one user-defined CDR operating parameter comprises a reference clock signal division parameter, a division parameter for dividing a first feedback clock signal to the phase detector circuitry and a second division parameter for further dividing the first feedback clock signal to produce the second feedback clock signal to the phase frequency detector circuitry; and
reset circuitry configured to reset the phase detector circuitry and the phase frequency detector circuitry, wherein the I/O interface is configured to reprogram the at least one default CDR operating parameter with the at least one user-defined CDR operating parameter without powering down the CDR circuitry, wherein the reset circuitry is configured to reset the phase detector circuitry and the phase frequency detector circuitry while the I/O interface reprograms the at least one default CDR operating parameter, and wherein the phase detector circuitry and the phase frequency detector circuitry are distinct and coupled to a reset signal output by the reset circuitry that operates without resetting circuitry within the CDR circuitry other than the phase detector circuitry and the phase frequency detector circuitry.

17. The CDR circuitry of claim 16 wherein the phase detector circuitry is part of phase locked loop circuitry.

18. The CDR circuitry of claim 16 wherein the I/O interface comprises an MDIO interface.

19. The CDR circuitry of claim 16 wherein the at least one user-defined CDR operating parameter allows the CDR circuitry to support at least one communications standard selected from the group consisting of PCI-E, CEI, GIGE, XUAI, SONET OC-48, and SONET OC-12.

20. The CDR circuitry of claim 16 wherein the at least one default CDR operating parameter is user-programmable.

* * * * *